(12) United States Patent
Yamamoto et al.

(10) Patent No.: US 11,594,426 B2
(45) Date of Patent: Feb. 28, 2023

(54) LAMINATE AND METHOD FOR PRODUCING LAMINATE

(71) Applicant: AGC Inc., Tokyo (JP)

(72) Inventors: Hirofumi Yamamoto, Tokyo (JP); Yasuhiko Akao, Tokyo (JP); Teruo Fujiwara, Tokyo (JP); Nobuhiko Imajo, Tokyo (JP)

(73) Assignee: AGC INC., Tokyo (JP)

( * ) Notice: Subject to any disclaimer, the term of this patent is extended or adjusted under 35 U.S.C. 154(b) by 317 days.

(21) Appl. No.: 16/880,286

(22) Filed: May 21, 2020

(65) Prior Publication Data

US 2020/0279756 A1    Sep. 3, 2020

Related U.S. Application Data

(63) Continuation of application No. PCT/JP2019/032173, filed on Aug. 16, 2019.

(30) Foreign Application Priority Data

Dec. 21, 2018  (JP) .............................. JP2018-240262

(51) Int. Cl.
*H01L 21/56* (2006.01)
*C03C 3/087* (2006.01)
(Continued)

(52) U.S. Cl.
CPC ............ *H01L 21/568* (2013.01); *C03C 3/087* (2013.01); *C03C 17/225* (2013.01);
(Continued)

(58) Field of Classification Search
CPC ....... B32B 9/00; B32B 17/06; C23C 14/0652; C23C 14/0036; C03C 17/09;
(Continued)

(56) References Cited

U.S. PATENT DOCUMENTS 4,066,344 A * 1/1978 Talapatra ................. G02B 5/10
                                                    359/848
2015/0146286 A1* 5/2015 Hagen ..................... G02B 5/26
                                                    359/359
(Continued)

FOREIGN PATENT DOCUMENTS

CN   104024170 A    9/2014
JP   2015-512854 A  4/2015
(Continued)

OTHER PUBLICATIONS

International Searching Authority, "International Search Report," issued in connection with International Patent Application No. PCT/JP2019/032173, dated Nov. 19, 2019.
(Continued)

*Primary Examiner* — Jaehwan Oh
(74) *Attorney, Agent, or Firm* — Foley & Lardner LLP

(57) ABSTRACT

A laminate including a glass plate and a coating layer, wherein the coating layer includes one or more components selected from the group consisting of silicon nitride, titanium oxide, alumina, niobium oxide, zirconia, indium tin oxide, silicon oxide, magnesium fluoride, and calcium fluoride, wherein a ratio (dc/dg) of a thickness dc of the coating layer to a thickness dg of the glass plate is in a range of $0.05 \times 10^{-3}$ to $1.2 \times 10^{-3}$, and wherein a radius of curvature r1 of the laminate with negating of self-weight deflection is 10 m to 150 m.

19 Claims, 2 Drawing Sheets

(51) Int. Cl.
*C03C 17/22* (2006.01)
*C23C 14/00* (2006.01)
*C23C 14/06* (2006.01)
*C23C 14/08* (2006.01)
*C23C 14/34* (2006.01)

(52) U.S. Cl.
CPC ...... *C23C 14/0036* (2013.01); *C23C 14/0652* (2013.01); *C23C 14/083* (2013.01); *C23C 14/3407* (2013.01); *H01L 21/561* (2013.01); *H01L 21/566* (2013.01); *C03C 2218/155* (2013.01)

(58) Field of Classification Search
CPC .............. C03C 17/225; C03C 17/2456; C03C 2217/212; C03C 2217/281; C03C 2218/155; C03C 3/087; H01L 21/568; H01L 2224/96
See application file for complete search history.

(56) References Cited

U.S. PATENT DOCUMENTS

2015/0166402 A1    6/2015   Muguruma et al.
2019/0084868 A1    3/2019   Nomura et al.

FOREIGN PATENT DOCUMENTS

JP           2017-030997 A     2/2017
WO    WO-2017/204167 A1    11/2017

OTHER PUBLICATIONS

International Searching Authority, "Written Opinion," issued in connection with International Patent Application No. PCT/JP2019/032173, dated Nov. 19, 2019.

\* cited by examiner

LAMINATE AND METHOD FOR PRODUCING LAMINATE

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2019/032173 filed on Aug. 16, 2019 and designating the U.S., which claims priority of Japanese Patent Application No. 2018-240262 filed on Dec. 21, 2018. The entire contents of the foregoing applications are incorporated herein by reference.

BACKGROUND OF THE INVENTION

1. Field of the Invention 1.5 The present invention relates to a laminate and a method for producing the laminate, and more specifically to a support glass substrate used for supporting a processed substrate in a production step of a semiconductor package.

2. Description of the Related Art

In wafer level packages (WLP), a fan-out WLP has been proposed. With the fan-out WLP, it is known that a glass substrate that supports a processed substrate is used to reduce a dimensional change of the processed substrate. (For example, see Japanese Laid-Open Patent Publication No. 2017-30997)

However, as illustrated in FIG. 1, the steps for producing WLP include steps of high temperature conditions such as a step of laminating a release layer and a step of generating a resin mold, and the substrate may be warped by heat.

To control warpage, an approach using a support glass substrate with a smaller warpage has been studied, but studies have not been conducted for the purpose of cancelling warpage caused in a step of producing a WLP by warping or curving in advance the support glass substrate in a direction opposite to the warpage caused in the step of producing the WLP.

It is known that a warpage occurs when a glass substrate is coated with a thin film (International Publication No. 2017/204167), but techniques for efficiently enabling such a warpage or curvature with a thinner film on a glass plate have not been studied.

SUMMARY OF THE INVENTION

It is easy to increase curvature of a laminate by increasing the thickness of a coating layer, but in a production step of a fan-out WLP, separation between a processed substrate and a support substrate is enabled by emitting visible light wavelength laser to a release layer, and therefore, the material of the coating layer and the thickness of the coating layer impede laser transmission, which result in problems.

Under such circumstances, a support glass substrate material having a large curvature while maintaining visible light transmittance is desired.

The inventors of the present application have found that the above problems can be solved by a laminate having a particular curvature and configuration and a method for producing a laminate under a particular condition.

More specifically, the present invention provides a laminate including a glass plate and a coating layer, wherein the coating layer includes one or more components selected from the group consisting of silicon nitride, titanium oxide, alumina, niobium oxide, zirconia, indium tin oxide, silicon oxide, magnesium fluoride, and calcium fluoride, wherein a ratio (dc/dg) of a thickness dc of the coating layer to a thickness dg of the glass plate is in a range of $0.05 \times 10^{-3}$ to $1.2 \times 10^{-3}$, and wherein a radius of curvature r1 of the laminate with negating of self-weight deflection is 10 m to 150 m.

According to the present invention, a laminate with a large curvature can be provided while maintaining visible light transmission property. Furthermore, when the laminate is used as a support glass substrate, a WLP with a high degree of accuracy in dimension can be produced.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

Other objects and further features of an embodiment will become apparent from the following detailed description when read in conjunction with the accompanying drawings, in which.

DETAILED DESCRIPTION OF THE PREFERRED EMBODIMENTS

Figure 1:
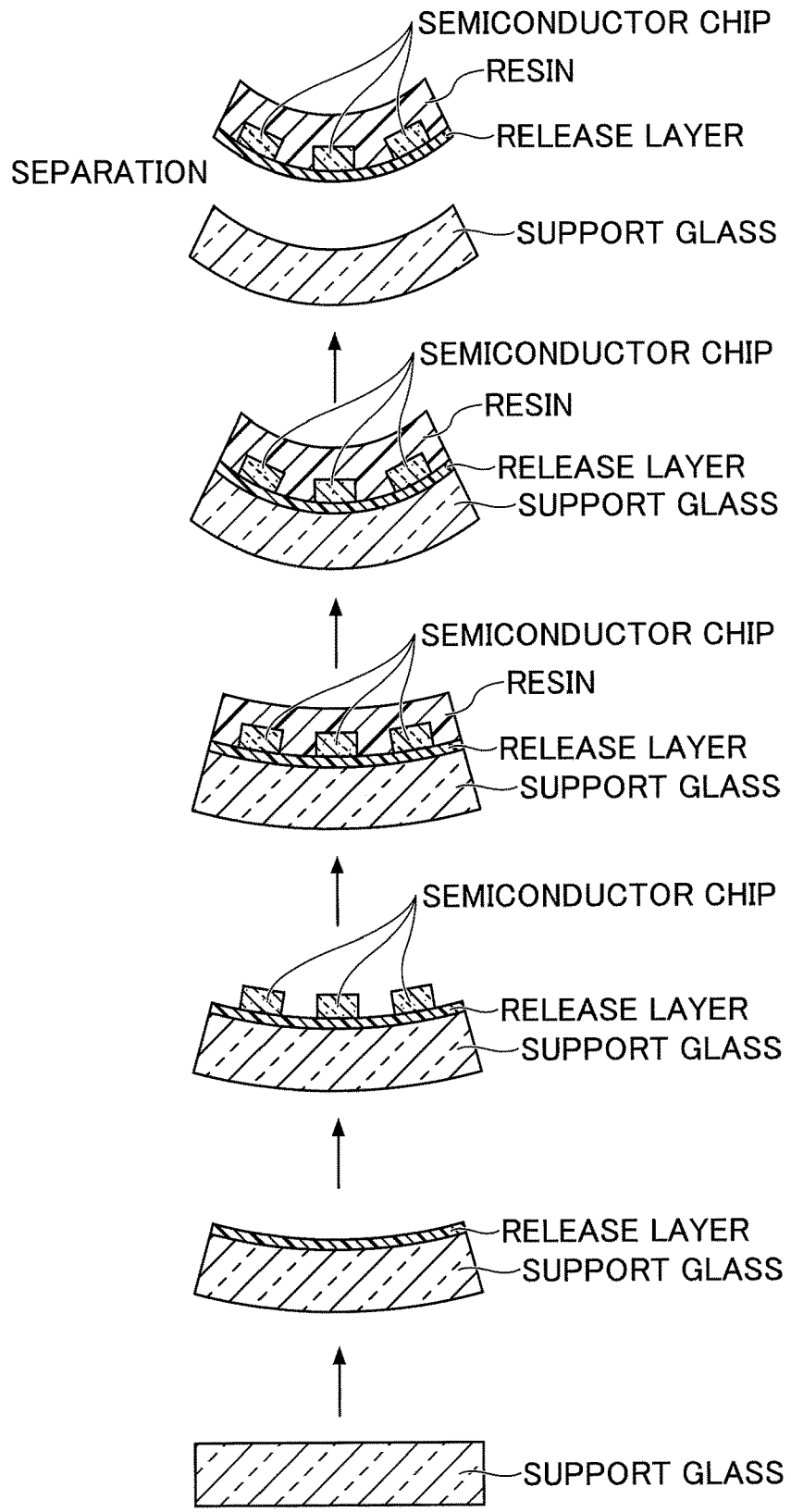
FIG. 1 is an example of conventional WLP production steps (up to support substrate release)

Hereinafter, an embodiment of the present invention will be explained with reference to the drawings.

A laminate and a method for producing the laminate according to the present invention will be explained. A numerical range between any given number "to" another number is to be understood as inclusive, i.e., the numerical range includes these numbers before and after the term "to" as an upper limit value and a lower limit value, respectively, unless otherwise specified.

[Glass composition]

A composition of a glass plate used for a laminate according to the present invention is not particularly limited, and a known composition with a high visible light transmittance can be used. More specifically, a composition having a minimum transmittance (T %) of 60% or more at a wavelength of 400 nm to 1000 nm can be used.

Compositions of the glass plate preferably include, as expressed in oxide-based mass percentage:
$SiO_2$ at 40% to 70%,
$B_2O_3$ at 0% to 15%,
$MgO$ at 0% to 10%,
$CaO$ at 0% to 10%,
$SrO$ at 0% to 13%,
$BaO$ at 0% to 40%,
$Na_2O$ at 0% to 30%,
$K_2O$ at 0% to 13%, and
$Al_2O_3$ at 0.5% to 15%.

More preferably, the compositions of the glass plate include, as expressed in oxide-based mass percentage:
$SiO_2$ at 49% to 70%, $B_2O_3$ at 4% to 13%,
MgO at 0% to 0.5%,
CaO at 0% to 8%,
SrO at 0% to 8%,
1.5 BaO at 0% to 13%,
$Na_2O$ at 4% to 15%,
$K_2O$ at 0.1% to 13%, and
$Al_2O_3$ at 4% to 13%.

When the composition is within this range, the visible light transmittance is excellent. In addition, in glass compositions of which the coefficients of thermal expansion are high, warpage is greatly affected by thermal treatment, and accordingly, the effect of the present invention is particularly significant.

[Glass Plate]

A glass plate is used for a laminate according to the present invention. For example, the glass plate is produced by forming the above glass compositions into a plate having a predetermined shape (for example, a quadrangular shape or a disk shape).

A method for forming a glass plate is not limited, and for example, known methods such as a float method, a fusion method, and a roll-out method can be used. In the present invention, in order to greatly curve the laminate, it is preferable that a glass plate has a certain curvature before the glass plate is coated.

As a curvature of a glass plate before coating, a radius of curvature r0 is preferably 200 m to 500 m, and more preferably 300 m to 400 m, with negating of self-weight deflection. (These values are of real glass plate curvature, i.e., curvature inherent to only the glass plate, corrected to negate effects of deflection in relation to weight of the glass plate.) When the curvature of the glass plate before coating falls within this range, the curvature of a laminate caused by coating explained below increases.

For example, a glass plate that falls within such a condition can be easily obtained by cutting out a portion having a curvature in the above range from a base plate produced by floating method.

A plate thickness (dg) of a glass plate is preferably 0.3 mm to 3.0 mm, more preferably 0.5 mm to 2.0 mm, and still more 1.5 preferably 0.7 mm to 1.2 mm. When the plate thickness (dg) of the glass plate falls within this range, the strength as the laminate appreciably increases, and the weight also falls within an acceptable range. Also, a chemically strengthened glass plate may be used.

[Coating Layer]

In the present invention, a coating layer is formed by coating the glass plate with a thin film. The coating layer includes one or more components selected from the group consisting of silicon nitride, titanium oxide, alumina, niobium oxide, zirconia, indium tin oxide, silicon oxide, magnesium fluoride, and calcium fluoride. Silicon nitride and titanium oxide are superior in visible light transmission property and superior in the effect of curving a laminate, and are therefore preferable.

As a coating method, a known method such as a sputtering method, an ion assist deposition method, and an aerosol deposition method can be used. Among them, the sputtering method is preferable because it is excellent in the effect of curving a laminate. Then, a convex surface side of the glass plate having the curvature specified above is coated, thereby increasing the curvature of the glass plate.

The thickness of the coating layer (dc) is preferably 0.05 µm to 1.2 µm, more preferably 0.1 µm to 1.0 µm, and still more preferably 0.4 µm to 0.6 µm. When the thickness of the coating layer (dc) falls within this range, both of a large curvature of the laminate and a high visible light transmission property can be achieved.

[Laminate]

The laminate according to the present invention includes the glass plate and the coating layer. A radius of curvature r1 with negating of self-weight deflection is in a range of 10 m to 150 m, and is preferably in a range of 30 m to 100 m. When the radius of curvature r1 falls within this range, a WLP with a high degree of accuracy in dimension can be produced.

A ratio (dc/dg) of a thickness (dc) of the coating layer to a thickness (dg) of the glass plate is $0.05 \times 10^{-3}$ to $1.2 \times 10^{-3}$, and preferably in a range of $0.4 \times 10^{-3}$ to $0.5 \times 10^{-3}$. When the ratio (dc/dg) falls within this range, both of a large curvature of the laminate and a high visible light transmission property can be achieved.

The thickness of the laminate is preferably 0.3 mm to 3.5 mm, more preferably 0.5 mm to 2.5 mm, and still more particularly 0.7 mm to 1.3 mm. When the thickness of the laminate falls within this range, both of a high strength of the laminate and a high visible light transmission property can be achieved.

The shape of the laminate is a quadrangular shape or a disk shape.

The laminate can be preferably used as a support glass substrate.

[Method for Producing Laminate]

Figure 2:
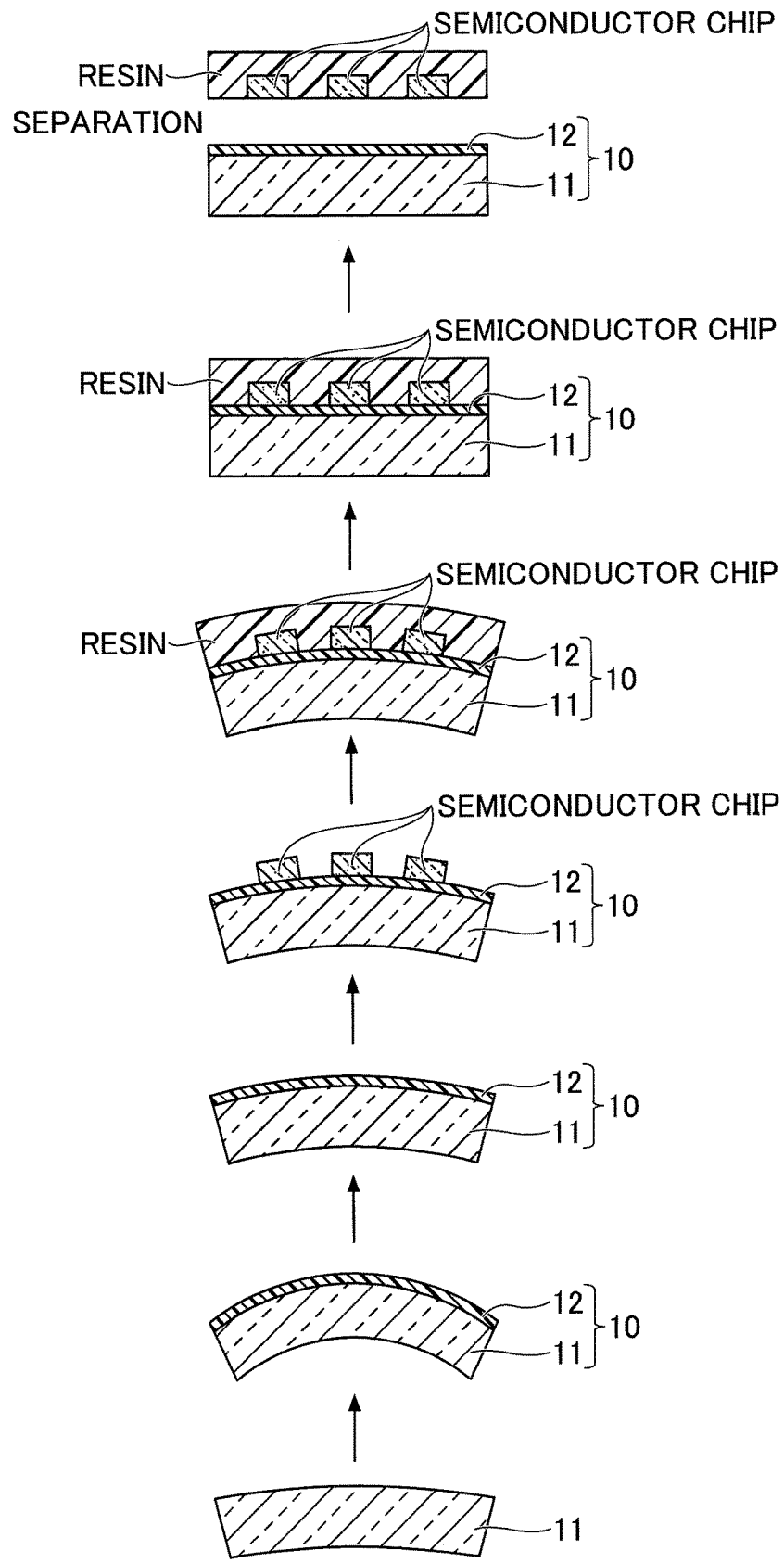
FIG. 2 is an example of WLP production steps (up to support substrate release) using a laminate according to the present invention as a support glass substrate.

The laminate according to the present invention can be produced by coating the glass plate. A specific example of a preferable production method has a condition including a step of, as illustrated in FIG. 2, coating a protruding side of the glass plate 11 having a curvature, of which a radius of curvature r0 with negating of self-weight deflection is 200 m to 500 m, with a thin film (coating layer) 12 including one or more components selected from the group consisting of silicon nitride, titanium oxide, alumina, niobium oxide, zirconia, indium tin oxide, silicon oxide, magnesium fluoride, and calcium fluoride. By producing the laminate under this condition, the laminate 10 of which the radius of curvature r1 of the laminate 10 with negating of self-weight deflection is 10 m to 150 m or less can be obtained in a preferable manner.

EXAMPLES

Hereinafter, the present invention will be described in detail by way of Examples and Comparative Examples. However, as long as advantages of the present invention can be achieved, embodiments can be changed as appropriate.

<Evaluation Sample Shape>

Glass plates in a disk shape having a diameter of 150 mm (6 inch) and a plate thickness of 1.0 mm coated under conditions 1.5 as described in Table 1 were used.

<Measurement Conditions and Evaluation Conditions>

[Measurement of Thickness of Glass Plate (Dg) and Thickness of Coating Layer (Dc)]

Using a laser displacement meter (Dyvoce manufactured by Kohzu Precision Co., Ltd.) under a room temperature condition, the thickness dg of the glass plate before coating and the thickness dc of the laminate after the coating were measured. As a result, the thickness dg and the thickness dc were obtained.

[Radiuses of Curvatures (r0, r1) of Glass Plate and Laminate]

Using the laser displacement meter (Dyvoce manufactured by Kohzu Precision Co., Ltd.), the shapes of the samples were calculated through shape simulation on the basis of the curvatures inherent to the samples derived through self-weight deflection correction in "both sides difference calculation mode". Then, the radiuses of curvatures were derived from the shapes obtained through the simulation.

A radius of curvature of a glass plate, before coating, with negating of self-weight deflection is denoted as r0. A radius of curvature of a glass plate of a laminate, after coating, with negating of self-weight deflection is denoted as r1.

[Evaluation of Curvature]

In general, the thicker a coating layer is, the larger a curvature caused by the coating becomes. For this reason, the curvature was evaluated based on a value R expressed by Expression 1. Among ranges A to D of the value R, ranges A, B, and C were evaluated as "acceptable".

$$R = r1 \ (m) \times dc \ (\mu m) \qquad \text{Expression 1}$$

<Ranges of R>
A: R≤30,
B: 30<R≤50,
C: 50<R<70,
D: 70≤R

[Visible Light Transmission Property]

Using a spectrophotometer (V-700 manufactured by JASCO Corporation) under a room temperature condition, a minimum value (T %) of a transmittance of each sample at a wavelength of 400 to 1000 nm was measured. Among ranges A to C of the minimum value (T %), ranges A and B were evaluated as "acceptable".

<Ranges of I>
A: 80%≤T,
B: 60%≤T<80%,
C: T<60%

Example 1

A base plate (a length and width of 1000 mm and a thickness of 1.4 mm) of glass having a composition 1 (including, as expressed in mass percentage, $SiO_2$ at 56.9%, $Al_2O_3$ at 8.1%, CaO at 2.3%, SrO at 12.3%, and BaO at 20.4%) was obtained by floating method. A circular shape having a radius of 75 mm (a diameter of 150 mm) from a central portion of the base plate was cut out from the base plate, so that a disk shaped glass plate was obtained. After, the disk shaped glass plate was chamfered, the disk shaped glass plate was polished by a double-sided lapping and polishing machine (16B-N/F manufactured by HAMAI CO., LTD.), whereby the plate thickness (dg) was adjusted to 1.0 mm. The radius of curvature r0 (caused by float method) of the glass plate was 370 m with negating of self-weight deflection.

Thereafter, using a silicon target with a sputtering system (SIV-345XYSSS manufactured by ULVAC, Inc.), a silicon nitride film was formed on a convexly curved surface of the glass plate by reactive sputtering so that a compressive stress of the film becomes 1 GPa. The thickness (dc) of the coating layer was 0.5 μm. The evaluation results are shown in Table 1.

Example 2 to Example 7 and Comparative Examples 1 to 4

Operations were performed in a manner similar to the operation of Example 1 except for changing the conditions to those as described in Table 1. The evaluation results are shown in Table 1.

TABLE 1

| | Glass Composition | Coating Layer | Coating Method | dc (μm) | dg (mm) | dc/dg (×10−3) | r0 (m) | r1 (m) | Evaluation T (%) | R = r1 × dc |
|---|---|---|---|---|---|---|---|---|---|---|
| Example 1 | Composition 1 | Silicon Nitride | Sputtering | 0.5 | 1 | 0.5 | 370 | 55 | 84(A) | 27.5(A) |
| Example 2 | Composition 2 | Silicon Nitride | Sputtering | 0.5 | 1 | 0.5 | 370 | 54 | 84(A) | 27(A) |
| Example 3 | Composition 1 | Titanium Oxide | Sputtering | 0.4 | 1 | 0.4 | 370 | 60 | 75(B) | 24(A) |
| Example 4 | Composition 1 | Silicon Nitride | Sputtering | 1 | 1 | 1 | 370 | 37 | 60(B) | 37(B) |
| Example 5 | Composition 1 | Silicon Nitride | Sputtering | 0.1 | 1 | 0.1 | 370 | 113 | 87(A) | 11.3(A) |
| Example 6 | Composition 1 | Silicon Nitride | Ion Deposition | 0.5 | 1 | 0.5 | 370 | 100 | 83(A) | 50(B) |
| Example 7 | Composition 1 | Silicon Nitride | Aerosol Deposition | 0.7 | 1 | 0.7 | 370 | 98 | 80(A) | 68.6(C) |
| Comparative Example 1 | Composition 1 | Chromium | Sputtering | 0.5 | 1 | 0.5 | 370 | 70 | ≤50(D) | 35(B) |
| Comparative Example 2 | Composition 1 | Tantalum Oxide | Sputtering | 0.8 | 1 | 0.8 | 370 | 640 | 84(A) | 512(D) |
| Comparative Example 3 | Composition 1 | Silicon Nitride | Sputtering | 1.5 | 1 | 1.5 | 370 | 11 | 55(D) | 16.5(A) |
| Comparative Example 4 | Composition 1 | Silicon Nitride | Sputtering | 0.5 | 1 | 0.5 | 1000 | 194 | 84(A) | 97(D) |

(Mass Percentage)
*Composition 1:
$SiO_2$: 56.9%,
$Al_2O_3$: 8.1%,
CaO: 2.3%,
SrO: 12.3%, and
BaO: 20.4%.
*Composition 2:
$SiO_2$: 68.9%,
$Al_2O_3$: 5.9%,
MgO: 4.1%,
CaO: 7.3%,
$Na_2O$: 14.6%, and
$K_2O$: 0.2%.

Although the preferred embodiment and examples of the present invention have been described in detail above, the present invention is not limited to the embodiment and examples described above, and various modifications and substitutions can be applied to the embodiment and examples described above without departing from the scope of the present invention.

What is claimed is:

1. A laminate comprising a glass plate and a coating layer, wherein the coating layer includes one or more components selected from the group consisting of silicon nitride, titanium oxide, alumina, niobium oxide, zirconia, indium tin oxide, silicon oxide, magnesium fluoride, and calcium fluoride, a ratio (dc/dg) of a thickness dc of the coating layer to a thickness dg of the glass plate is in a range of $0.4 \times 10^{-3}$ to $1.2 \times 10^{-3}$, and a radius of curvature rl of the laminate with negating of self-weight deflection is 10 m to 150 m.

2. The laminate according to claim 1, wherein the thickness dg is in a range of 0.3 mm to 3.0 mm, and the thickness dc is in a range of 0.05 μm to 1.2 μm.

3. The laminate according to claim 1, wherein a composition of glass used for the glass plate includes, as expressed in mass percentage:

$SiO_2$ at 40% to 70%,
$B_2O_3$ at 0% to 15%,
MgO at 0% to 10%,
CaO at 0% to 10%,
SrO at 0% to 13%,
BaO at 0% to 40%,
$Na_2O$ at 0% to 30%,
$K_2O$ at 0% to 13%, and
$Al_2O_3$ at 0.5% to 15%.

4. The laminate according to claim 1, wherein a shape of the laminate is a quadrangular shape or a disk shape.

5. The laminate according to claim 1, wherein the laminate is used as a support glass substrate.

6. A method for producing the laminate according to claim 1, comprising:

coating a protruding side of a glass plate having a curvature, of which a radius of curvature r0 with negating of self-weight deflection is 200 m to 500 m, with a thin film including one or more components selected from the group consisting of silicon nitride, titanium oxide, alumina, niobium oxide, zirconia, indium tin oxide, silicon oxide, magnesium fluoride, and calcium fluoride.

7. The method for producing the laminate according to claim 6, wherein the coating method is a sputtering method.

8. The laminate according to claim 1, wherein the ratio dc/dg is in a range of $0.4 \times 10^{-3}$ to $0.5 \times 10^{-3}$.

9. The laminate according to claim 2, wherein the ratio dc/dg is in a range of $0.4 \times 10^{-3}$ to $0.5 \times 10^{-3}$.

10. The laminate according to claim 8, wherein the thickness of the coating layer is 0.4 μm to 0.6 μm and the thickness of the glass plate is 0.7 mm to 1.2 mm.

11. The laminate according to claim 1, wherein the coating layer consists of silicon nitride.

12. The laminate according to claim 2, wherein the coating layer consists of silicon nitride.

13. The laminate according to claim 10, wherein the coating layer consists of silicon nitride.

14. The method for producing the laminate according to claim 6, wherein a thickness of the glass plate is in a range of 0.3 mm to 3.0 mm, and a thickness of the coating layer is in a range of 0.05 μm to 1.2 μm.

15. The method for producing the laminate according to claim 14, wherein the thickness of the coating layer is 0.4 μm to 0.6 μm and the thickness of the glass plate is 0.7 mm to 1.2 mm.

16. The method for producing the laminate according to claim 14, wherein the coating layer consists of silicon nitride.

17. The method for producing the laminate according to claim 15, wherein the coating layer consists of silicon nitride.

18. The method for producing the laminate according to claim 6, wherein the radius of curvature r0 with negating of self-weight deflection is 300 m to 400 m.

19. The laminate according to claim 11, wherein the radius of curvature rl of the laminate with negating of self-weight deflection is 54 m to 150 m.

* * * * *